US007822589B2

(12) United States Patent
Bhattacharya et al.

(10) Patent No.: US 7,822,589 B2
(45) Date of Patent: Oct. 26, 2010

(54) METHOD AND APPARATUS FOR AUTOMATIC GENERATION OF MULTIPLE INTEGRATED CIRCUIT SIMULATION CONFIGURATION

(75) Inventors: Rajarshi Bhattacharya, Karnataka (IN); Sriram Gorti, Bangalore (IN); Vinoj N. Kumar, Austin, TX (US); Chandramouleeswaran Sankaran, Bangalore (IN); Tirthendu Sarkar, Bangalore (IN)

(73) Assignee: Agere Systems Inc., Allentown, PA (US)

( * ) Notice: Subject to any disclaimer, the term of this patent is extended or adjusted under 35 U.S.C. 154(b) by 759 days.

(21) Appl. No.: 10/620,045

(22) Filed: Jul. 15, 2003

(65) Prior Publication Data

US 2005/0015234 A1    Jan. 20, 2005

(51) Int. Cl.
*G06F 17/50*    (2006.01)
(52) U.S. Cl. ....................................................... 703/14
(58) Field of Classification Search ..................... 703/14
See application file for complete search history.

(56) References Cited

U.S. PATENT DOCUMENTS

| | | | | |
|---|---|---|---|---|
| 6,996,799 | B1 * | 2/2006 | Cismas et al. ............... | 717/106 |
| 7,274,690 | B1 * | 9/2007 | Park et al. .................. | 370/388 |
| 7,461,167 | B1 * | 12/2008 | Park ........................... | 709/240 |
| 7,505,422 | B1 * | 3/2009 | Park ........................... | 370/256 |
| 2002/0186245 | A1 * | 12/2002 | Chandhoke et al. ......... | 345/764 |
| 2003/0038842 | A1 * | 2/2003 | Peck et al. .................. | 345/763 |

OTHER PUBLICATIONS

Boggio et al "NetworkDesigner-Artifex-OptSim: A Suite of Integrated Software Tools for Synthesis and Analysis of High Speed Networks", Optical Networks Magazine, Sep./Oct. 2001.*
Ishida et al "A 10-GHz 8-b Multiplexer/Demultiplexer Chip Set for the SONET STS-192 System", IEEE Journal of Solid-State Circuits, vol. 26, No. 12, Dec. 1991.*
Sun et al "Simulation Studies of Multiplexing and Demultiplexing Performance in ATM Switch Fabrics", Performance Engineering in Telecommunications Network Teletraffic Symposium, Apr. 14-16, 1993, pp. 21/1-21/5.*
Whitlock et al "Simulation and Modeling: Simulating Optical Interconnects", IEEE Circuits and Devices Magazine, vol. 11, Issue 3, May 1995, pp. 12-18.*
Wang et al "A Distributed Switch Architecture with Dynamic Load-balancing and Parallel Input-Queued Crossbars for Terabit Switch Fabrics", IEEE INFOCOM 2002.*

(Continued)

*Primary Examiner*—Paul L Rodriguez
*Assistant Examiner*—Juan Ochoa
(74) *Attorney, Agent, or Firm*—Ryan, Mason & Lewis, LLP (57) ABSTRACT

A software-based development tool is operative to automatically determine an appropriate simulation configuration for a multistage switch fabric or other multiple circuit element electronic system. The development tool includes an interface permitting user control of one or more configurable parameters of the electronic system, and automatically generates a simulation configuration for the electronic system based on current values of the configurable parameters. The simulation configuration is advantageously generated without requiring further user input, and specifies interconnections between the circuit elements which satisfy the current values of the configurable parameters.

20 Claims, 5 Drawing Sheets

OTHER PUBLICATIONS

Krishnamurthy et al, "Dynamic Reconfiguration of an Optical Interconnect", Proceedings of the 36$^{th}$ Annual Simulation Symposium, ANSS '03, Mar. 30-Apr. 2, 2003.*

Ye et al, "Anaylsis of Power Consumption on Switch Fabrics in Network Routers", DAC2002, Jun. 10-14, 2002, New Orleans, LA.*

Harry Newton, "Newton's Telecom Dictionary", Mar. '05, 21st Edition, p. 852.*

W.E. Leland, "On the Self-Similar Nature of Ethernet Traffic," IEEE/ACM Transactions on Networking, pp. 1-46, Feb. 1994.

R. Bhattacharya et al., "Design of 160 Gbps Router with PI40 Switch Fabric and 10G Chipsets," Proceedings of the International Conference on Communications and Broadband Networking, ICBN '03, May 5-7, 2003, Bangalore, India, 4 pages, 2003.

D. Turner et al., "Protocol-Dependent Message-Passing Performance on Linux Clusters," 2002 IEEE International Conference on Cluster Computing (CLUSTER 2002), Chicago, IL, USA, pp. 187-194, Sep. 23-26, 2002.

NetPIPE, http://www.scl.ameslab.gov/netpipe/, pp. 1-2, May 2003.

"Welcome to the Public Netperf Homepage," http://www.netperf.org/netperf/NetperfPage.html, 1 page, Nov. 2003.

TTCP Utility, "Test TCP (TTCP) Benchmarking Tool for Measuring TCP and UDP Performance," http://www.pcausa.com/Utilities/pcattcp.htm, pp. 1-5, Feb. 2003.

Harry G. Perros, "Connection-Oriented Networks: SONET/SDH, ATM, MPLS and Optical Networks," John Wiley & Sons, Ltd., Optical Fibers and Components, 2005, p. 198.

K.M. Sivalingam et al., "Emerging Optical Network Technologies: Architectures, Protocols and Performance," Springer, Optical Packet Switching, 2005, p. 113.

* cited by examiner

METHOD AND APPARATUS FOR AUTOMATIC GENERATION OF MULTIPLE INTEGRATED CIRCUIT SIMULATION CONFIGURATION

RELATED APPLICATION(S)

The present invention is related to the invention described in U.S. patent application Ser. No. 10/609,781, filed Jun. 30, 2003 and entitled "Simulation Framework with Support for Multiple Integrated Circuits Having Potentially Differing Characteristics," the disclosure of which is incorporated by reference herein.

FIELD OF THE INVENTION

The present invention relates generally to the design of multistage switch fabrics or other electronic systems comprising multiple integrated circuits or other circuit elements, and more particularly to techniques for simulating the operation of such systems.

BACKGROUND OF THE INVENTION

In designing and otherwise developing electronic systems comprising multiple integrated circuits, it is common practice for the system operation to be simulated using software-based development tools. Such multiple-chip simulations are useful in determining the extent of any interface issues that may arise within the system due to various operational factors, including clocking, data transfer, etc.

Conventional software-based development tools suffer from a significant drawback in that such tools are generally unable to provide automated generation of a given system configuration based on multiple chips or other elements. For example, in setting up a typical multistage switch fabric configuration for purposes of simulation, there may be hundreds of chips to configure, with a correspondingly large number of ports to create, and thousands of connections to make between the ports in an appropriate order. Since conventional development tools fail to provide an automatic configuration generation capability, it is often necessary when using such tools to implement a costly and time-consuming manual process to determine a suitable simulation configuration prior to performing the simulation. Such manual processes tend to be tedious and prone to errors. Moreover, if the number of chips, ports or connections is too large for manual configuration, it may be infeasible or impractical to utilize the conventional software-based development tool for simulation of the corresponding system.

It is therefore apparent that a need exists for improved software-based development tools that can avoid the need for manual generation of a switch fabric configuration or other simulation configuration involving multiple integrated circuits or other circuit elements.

SUMMARY OF THE INVENTION

The present invention provides in an illustrative embodiment thereof an improved software-based development tool having a capability for automatic generation of multistage switch fabric configuration.

In accordance with one aspect of the invention, a software-based development tool is operative to automatically determine an appropriate simulation configuration for a multistage switch fabric or other multiple circuit element electronic system. The development tool includes an interface permitting user control of one or more configurable parameters of the electronic system, and automatically generates a simulation configuration for the electronic system based on current values of the configurable parameters. The simulation configuration is advantageously generated without requiring further user input, and specifies interconnections between the circuit elements which satisfy the current values of the configurable parameters.

In the illustrative embodiment, the electronic system comprises a multistage switch fabric generated as a combination of circuit elements including at least two ingress devices, at least one cross-connect device and at least two egress devices. These circuit elements may comprise integrated circuits of a designated chip set utilizable in the electronic system.

In accordance with another aspect of the invention, the interface may include a listing of a base device specified for the plurality of circuit elements, and may be configured to permit user control of one or more configurable parameters of the base device.

Exemplary configurable parameters include switching capacity, configuration type and number of ports. More specifically, in the case of a multistage switch fabric, a user may specify a desired switching capacity, a configuration type and a number of ports, and an appropriate simulation configuration for the multistage switch fabric is automatically generated. The different user-selectable configuration types in the multistage switch fabric case may comprise a centralized configuration, a stackable configuration and a distributed configuration.

The simulation configuration may be generated in an automatic configuration generation module of the software-based development tool. For example, the simulation configuration may be generated utilizing an object-oriented programming construct which includes a base class, corresponding to a specified base device, and an associated generation interface. The generation interface is preferably configured to declare a generate function that is implemented by each of a plurality of generators, with each of the plurality of generators corresponding to a different configuration of the electronic system. More specifically, the plurality of generators may comprise a centralized configuration generator, a stackable configuration generator and a distributed configuration generator, corresponding to respective centralized, stackable and distributed configurations of a multistage switch fabric of the electronic system.

Advantageously, the invention in the illustrative embodiment substantially reduces the amount of time required to determine an appropriate simulation configuration for a multistage switch fabric, so that users of the software-based development tool can focus their efforts on interpretation of simulation results.

DETAILED DESCRIPTION OF THE INVENTION

The present invention will be illustrated herein using an exemplary software-based development tool configured for automatic generation of multistage switch fabric configuration. It should be understood, however, that the techniques of the invention can be more generally applied to any type of circuit or system design application having sufficiently well-defined circuit elements and topology. The invention does not require the particular elements of the illustrative embodiment, and other elements can be used in addition to or in place of the particular elements shown.

Figure 1:
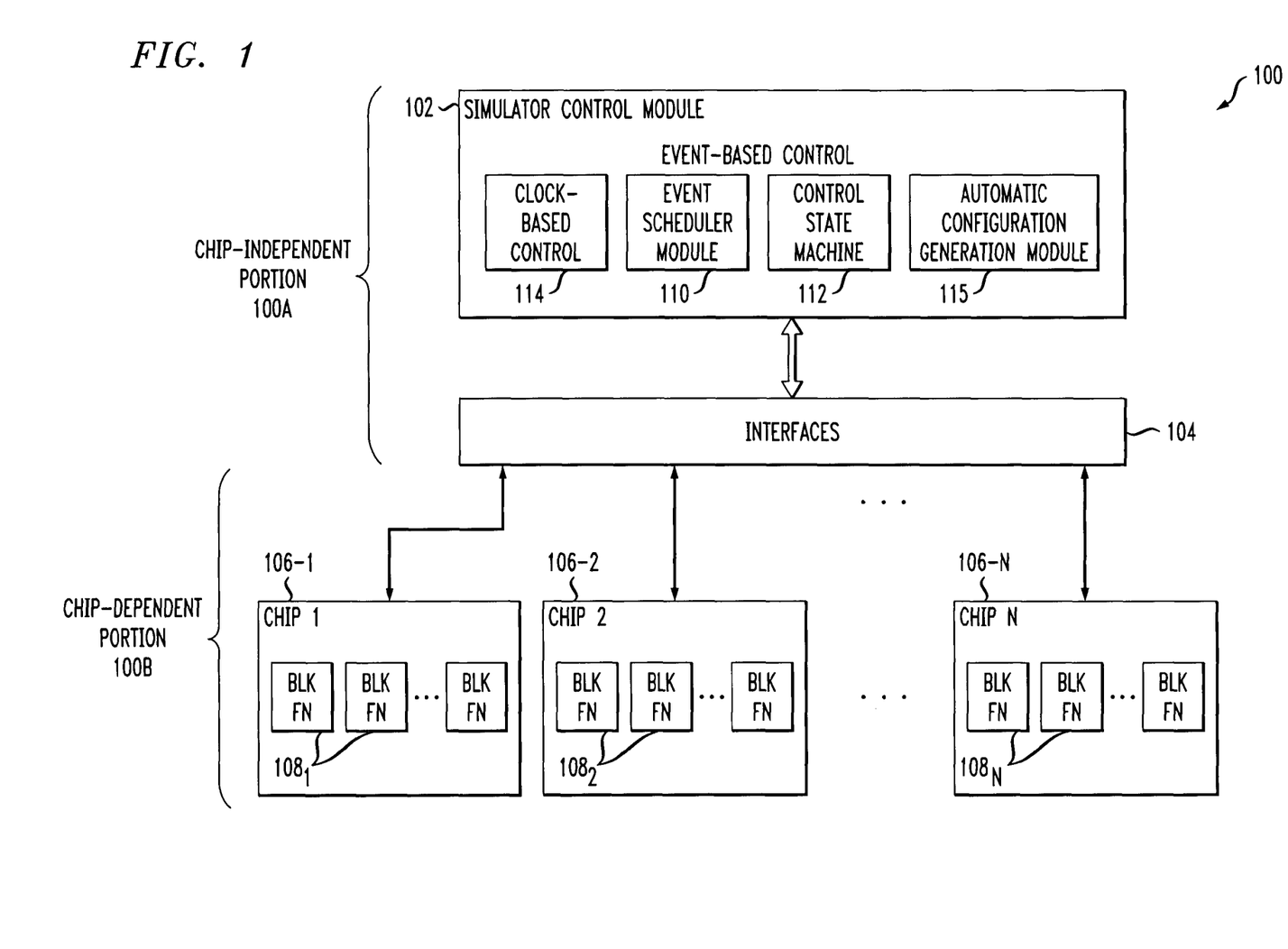
FIG. 1 shows an illustrative embodiment of a software-based development tool in which the present invention is implemented.

Referring now to FIG. 1, a software-based development tool 100 in which the invention is implemented includes a chip-independent portion 100A and a chip-dependent portion 100B. The chip-independent portion 100A comprises a simulator control module 102 and interfaces 104. The chip-dependent portion 100B comprises chip modules 106-1, 106-2, ... 106-N. The chip modules 106-1, 106-2, ... 106-N include respective block functions denoted $108_1$, $108_2$, ... $108_N$ as shown.

The term "chip" as used herein refers generally to an integrated circuit or other circuitry block to be simulated in a given system. A chip module denotes a corresponding set of information, characterizing the operation of the chip, that is utilizable in simulating the operation of the chip.

The simulator control module 102 includes event-based control comprising an event scheduler module 110 and a control state machine 112, and clock-based control 114. Additional description regarding the operation of these elements of the software-based development tool 100 can be found in the above-cited U.S. patent application Ser. No. 10/609,781, filed Jun. 30, 2003.

In accordance with an aspect of the invention, the simulator control module 102 includes an automatic configuration generation module 115. The present invention in the illustrative embodiment provides automatic generation of switch fabric configuration or other electronic system configuration in the development tool 100 at least in part utilizing the automatic configuration generation module 115.

Portions of a user interface of the development tool 100 associated with automatic configuration generation with be described below in conjunction with FIGS. 2 and 3. A class diagram for one possible implementation of the automatic configuration generation module 115 will be described in conjunction with FIG. 4. An example switch fabric configuration generatable using the development tool 100 will be described in conjunction with FIG. 5, and a corresponding switching system which includes the switch fabric as an element thereof will be described in conjunction with FIG. 6.

The software-based development tool in the illustrative embodiment is assumed to run at least in part on a general-purpose computer, workstation or other information processing device comprising at least one processor and an associated memory.

The automatic configuration generation and other software-based development tool functions described herein are implemented at least in part in the form of software comprising one or more programs stored in the memory of the information processing device and executed by the processor of the information processing device. The configuration and operation of such information processing devices are well-known in the art, and therefore not described in further detail herein.

It is also to be appreciated that the software-based development tool 100 in the illustrative embodiment may further include, in addition to the particular modules shown in the figure, additional modules and other elements of a type commonly found in conventional implementations of such tools. These conventional modules and other elements, being commonly used in the art, will not be described in detail herein.

Advantageously, the development tool 100 in the illustrative embodiment is configured so as to overcome the above-described significant drawback associated with conventional development tools. For example, the automatic configuration generation capability of the development tool avoids the need for manual determination of configuration prior to simulation, thereby reducing the time, effort and expense associated with system design. More specifically, with regard to automatic determination of switch fabric configuration, the development tool can automatically determine an appropriate configuration of chips, ports and connections for the switch fabric in simulating a given system design, with minimal input from the user.

The illustrative embodiment of the invention will be described in the context of a switch fabric configuration generated using a particular chip set, namely, the PI40 Protocol Independent Switch Fabric chip set commercially available from Agere Systems Inc. of Allentown, Pa., USA. This example chip set is described in greater detail in, for example, Agere Systems Product Brief, Protocol-Independent Switch Fabric (PI40), pages 1-8, March 2002, which is incorporated by reference herein.

It is to be appreciated, however, that use of the PI40 chip set in the following description is by way of illustrative example only. The invention does not require the use of any particular type of integrated circuits or other circuit elements in a given electronic system for which a simulation configuration is to be automatically generated in a software-based development tool.

The software-based development tool 100 in the illustrative embodiment supports a user interface associated with automatic configuration generation. The user interface is provided as part of what is referred to herein as a system performance analyzer (SPA) framework, and may be generated in a straightforward manner on a display of the above-noted information processing device. The SPA framework provides access to the various configurable aspects of the devices of the PI40 chip set and the interconnections between these devices. Portions of the user interface generated for the example PI40 chip set will now be described with reference to FIGS. 2 and 3.

Figure 2:
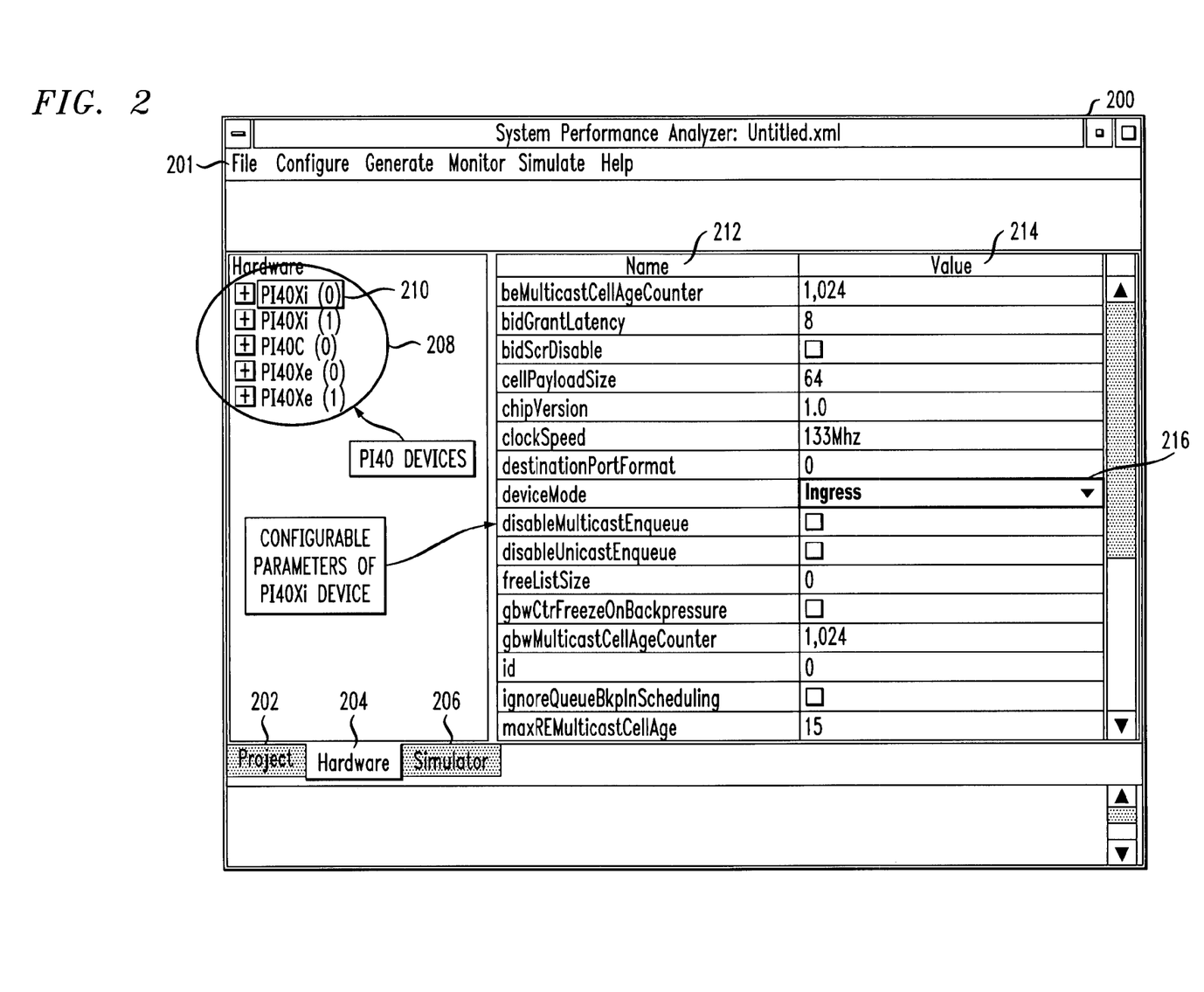
FIGS. 2 and 3 show portions of a system performance analyzer (SPA) user interface associated with automatic configuration generation in the illustrative embodiment of the invention.

Referring initially to FIG. 2, a first portion 200 of the user interface is shown. This portion comprises a display page which includes a command bar 201 having user-activatable command buttons for File, Configure, Generate, Monitor, Simulate and Help, and additional user-activatable command buttons 202, 204 and 206 for Project, Hardware and Simulator, respectively. The display page as illustrated in FIG. 2 corresponds to an example page that may be presented upon activation of the Hardware button 204, and shows the particular available hardware devices 208 of the PI40 chip set in a given application.

The PI40 chip set includes the devices PI40Xi, PI40C, and PI40Xe, also referred to herein as chips. A given PI40 switch fabric configuration comprises one or more of these three devices. The PI0Xi device is an ingress device, the PI40C device is a cross-connect device, and the PI40Xe device is an egress device. The PI40Xi devices are operative to buffer incoming traffic received at input ports of the switch fabric before the traffic is sent to one or more of the PI40Xe devices through one or more of the PI40C devices. The PI40C device acts as the switch for directing traffic from one or more PI40Xi devices to the appropriate PI40Xe devices. The PI40Xe devices are operative to buffer outgoing traffic before the traffic is sent out of the switch fabric via its output ports.

The devices of the PI40 chip set thus provide the core functionality of a router-based switching system. These devices may be combined with line cards or other suitable elements to form a switching system. In such an arrangement, the multistage switching fabric generally operates on a fixed cell size, with the line cards being utilized to convert input packets to switching cells and switching cells to output packets.

The particular number of PI40Xi, PI40C and PI40Xe chips in a given switch fabric is determined by the desired switching capacity, and the interconnections among the devices are dictated by the configuration. Example configurations include a centralized configuration, a stackable configuration and a distributed configuration. User-configurable parameters include, again by way of example, the switching capacity, number of devices, number of input ports on the PI40Xi devices, and number of output ports on the PI40Xe devices.

The numbers in parentheses following the device names in the set of chip set devices 208 indicate the instance number of the device. For example, if there are three PI40Xi devices used in a given application, the individual devices are designated as (0), (1) and (2). In the figure, the set 208 is illustratively shown as including two instances of each of the PI40Xi and PI40Xe devices, and a single instance of the PI40C device.

As shown in FIG. 2, a given chip set device 210 in the set of chip set devices 208 may be selected by a user, and the configurable parameters for the selected device are then shown in a pair of columns, including a name column 212 listing the names of the configurable parameters, and a value column 214 which lists specified values for the corresponding entries in the name column. There may be additional command buttons each associated with one or more particular entries, such as the command button 216 which allows a user to select from one of a number of available modes for a given device, although in this example the particular mode shown may be the only available mode for the selected PI40Xi device 210.

Figure 3:
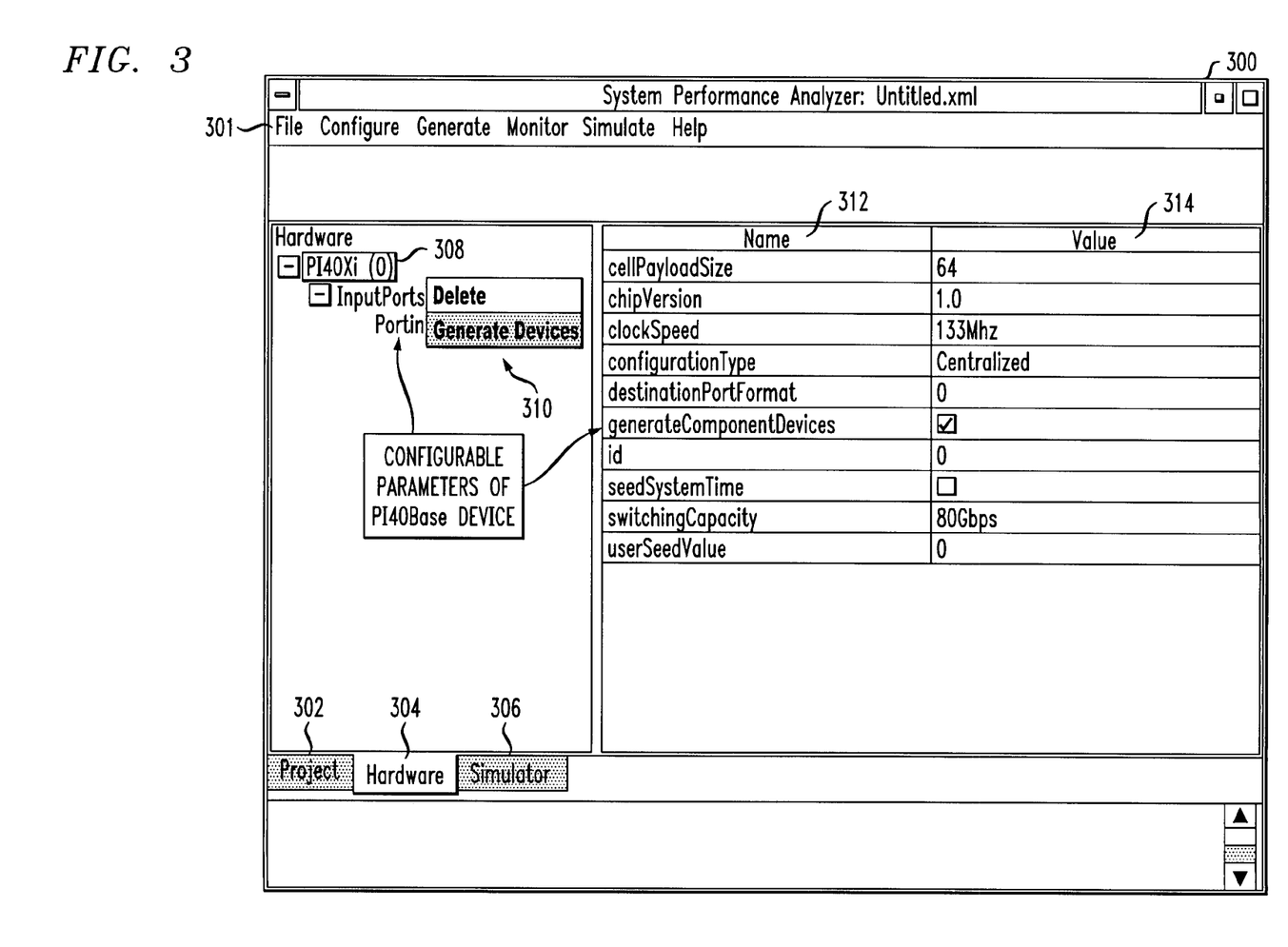

FIG. 3 shows a second portion 300 of the user interface. Similar to the first portion 200, the portion 300 comprises a display page which includes a command bar 301 having a number of user-activatable command buttons, as well as additional user-activatable command buttons 302, 304 and 306 for Project, Hardware and Simulator, respectively. The display page as illustrated in FIG. 3 corresponds to an example page presented upon activation of the Hardware button 304, and shows a PI40Base device 308. Associated with the PI40Base device is a command box 310 which permits execution of a deletion function, or execution of a generation of devices function for the PIBase device 308 in accordance with user-configurable parameters listed in name and value columns 312 and 314, respectively.

The base device configurable parameters, which as indicated in the user interface portion 300 of FIG. 3 include cell payload size, chip version, clock speed, configuration type, switching capacity, and so on, are provided as inputs to the automatic configuration generation module 115. The automatic configuration generation module processes the values of these parameters in conjunction with any other device configuration parameters entered via other portions of the user interface, such as the portion 200 of FIG. 2, and automatically generates a corresponding switch fabric configuration suitable for use in a system simulation in the development tool 100.

Figure 4:
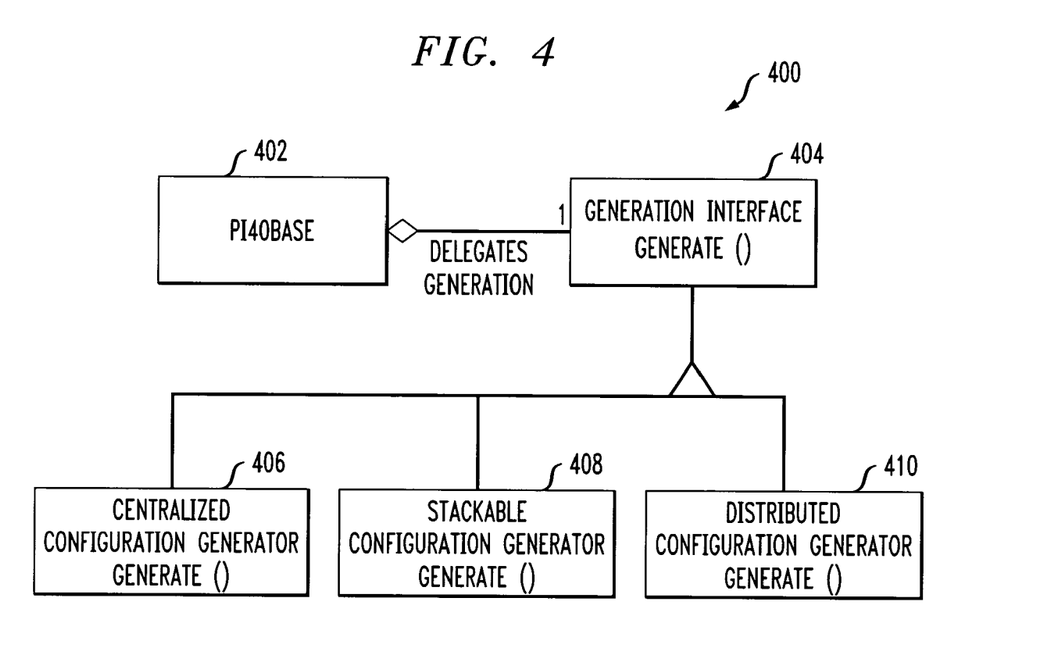
FIG. 4 is a class diagram of an example implementation of an automatic configuration generation module of the FIG. 1 software-based development tool in accordance with the invention.

The automatic configuration generation module 115 is preferably implemented using object-oriented programming techniques. FIG. 4 shows a class diagram 400 of one possible object-oriented implementation of the automatic configuration generation module 115. The module 115 in this implementation includes a PI40Base class 402 and an associated generation interface 404. A given PI40Base device thus comprises a single generation interface in this example. The generation interface 404 declares a function, denoted Generate( ). This function is implemented by each of three different generators, one for each of the different configurations associated with the PI40 chip set, including a centralized configuration generator 406, a stackable configuration generator 408, and a distributed configuration generator 410. Each of the generators 406, 408 and 410 includes algorithms for generating the corresponding configurations given the user-configurable parameters entered via the user interface as previously described.

An example of an algorithm for use in implementing the Generate( ) function for the centralized configuration generator 406 is as follows. It is assumed for this example that each ingress device can have 32 output links, and each egress device can have 32 input links. These input and output links are connected to the cross-connect device(s) in a pre-defined fashion specified by the algorithm. It is further assumed for this example that a given cross-connect device can support a maximum of 46 links. Its input links are fed by the output links of the ingress device(s), and its output links feed the input links of the egress device(s). The algorithm operates such that, from the standpoint of the cross-connect device, the input links of the cross-connect device are distributed across the ingress devices in a round-robin fashion.

Figure 5:
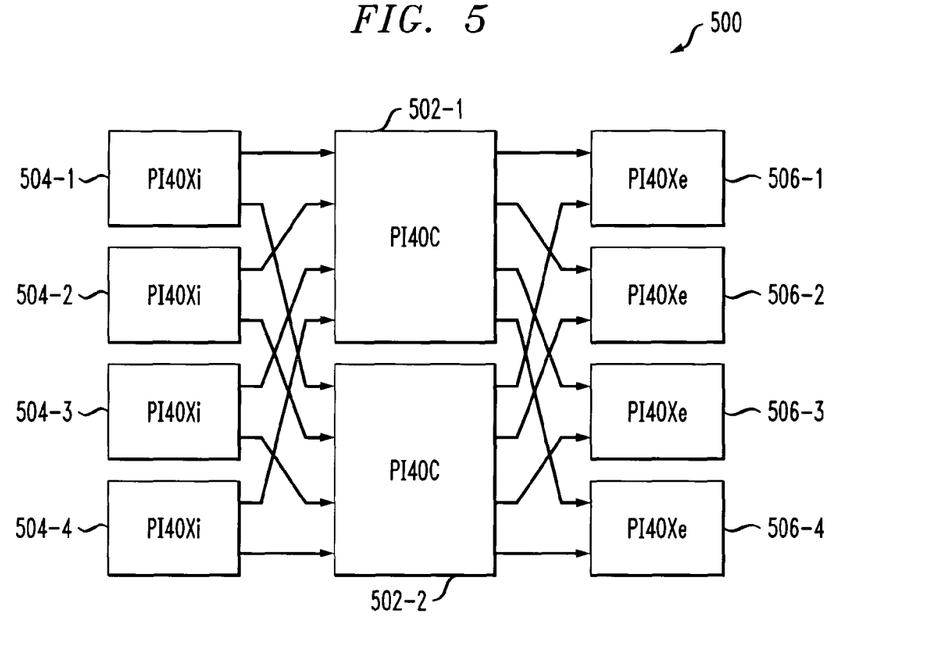
FIG. 5 shows an example switch fabric configuration which may be automatically generated in accordance with the invention.

Consider a system arrangement which includes four ingress devices, two cross-connect devices, and four egress devices, such as is illustrated in FIG. 5 of the drawings. The first input link of the pair of cross-connect devices is connected to an output link of the first ingress device, the second is connected to an output link of the second ingress device, the third is connected to an output link of the third ingress device, and the fourth is connected to an output link of the fourth ingress device. The fifth input link of the pair of cross-connect devices is again connected to an output link of the first ingress device, and the cycle is repeated. The algorithm further operates such that the same pattern is repeated for the connections between the output links of the cross-connect devices and the input links of the egress devices.

Suitable algorithms for implementing the Generate( ) function in the stackable configuration generator 408 and the distributed configuration generator 410 may operate in a manner similar to that described above for the centralized configuration generator 406, as will be readily apparent to those skilled in the art. Assignment techniques other than the round-robin technique of the above example can be used, including combinations of multiple techniques.

The illustrative embodiment of the invention as described above advantageously provides an improved software-based development tool which allows efficient determination of switch fabric configuration. More specifically, an advantage of the illustrative embodiment is that it substantially reduces the amount of time required to determine an appropriate simulation configuration for a multistage switch fabric, so that users of the software-based development tool 100 can focus their efforts on interpretation of simulation results.

Another advantage of the object-oriented implementation illustrated in FIG. 4 is that it is readily extensible to support any desired number of configurations. For example, the addition of another configuration could be accommodated by simply adding another class that implements the Generate( ) function. The existing generator classes corresponding to generators 406, 408 and 410 are not affected in any way by the addition of the new generator class.

FIG. 5 shows a simplified example of a simulation configuration for a multistage switch fabric 500 that may be generated using the techniques of the invention. The multistage switch fabric 500 is based on the above-described PI40 chip set, and includes four ingress devices 504-1 through 504-4, two cross-connect devices 502-1 and 502-2, and four egress devices 506-1 through 506-4, interconnected as shown. Although the switch fabric in this simplified example could be constructed using a conventional manual process, the inter-chip connections are greatly increased in number and complexity as the number of chips increases. The techniques of the invention considerably facilitate the generation of such simulation configurations for any desired number of chips.

Figure 6:
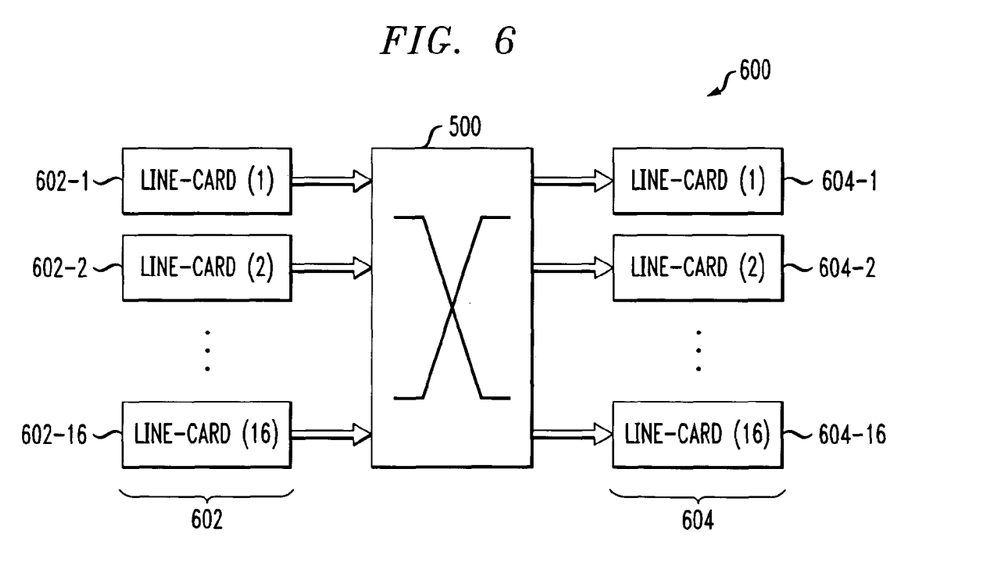
FIG. 6 shows an example switching system which includes the switch fabric of FIG. 5.

FIG. 6 shows a corresponding switching system comprising a router 600 which includes the multistage switch fabric 500. The router 600 is a 160 Gbps router and includes 16 input line cards 602-1 through 602-16, and 16 output line cards 604-1 through 604-16. Each of the line cards is operative to implement buffer management and scheduling policies.

In a simulation of the system 600, the software-based development tool 100 may generate simulated traffic that is supplied to the line cards. Examples of traffic generators suitable for use with the invention are described in U.S. patent application Ser. Nos. 10/620,258 and 10/620,044, both filed concurrently herewith and incorporated by reference herein. Although not shown in FIG. 1, such traffic generators may be incorporated within the software-based development tool 100. A single user interface can advantageously be used to control the traffic generator(s) as well as the generation of an appropriate simulation configuration, thereby accelerating the system design process.

As mentioned previously, one or more software programs for implementing the development tool functionality described herein may be stored in a memory of an information processing device and executed by a processor of that device.

It should again be emphasized that the above-described embodiment is intended to be illustrative only. For example, alternative embodiments may be configured which utilize different development tool modules or other system elements, user interface configurations, configurable parameters, base classes, generate functions or simulation techniques than those specifically described herein.

These and numerous other alternative embodiments within the scope of the following claims will be apparent to those skilled in the art.

What is claimed is:

1. A method of simulating the operation of at least one switch fabric comprising a plurality of integrated circuits of a designated chip set, utilizing a software-based development tool, the method comprising the steps of:
providing in the software-based development tool an interface for user control of configurable parameters of the switch fabric; and
automatically generating a simulation configuration for the switch fabric based on current values of the configurable parameters;
the simulation configuration being generated without requiring further user input;
the simulation configuration specifying interconnections between the integrated circuits which satisfy the current values of the configurable parameters;
wherein the configurable parameters of the switch fabric comprise one or more configurable parameters of each of the integrated circuits and configurable parameters of a base device for the designated chip set;
wherein each integrated circuit of the designated chip set corresponds to a specified ingress device, a specified cross-connect device or a specified egress device;
wherein the one or more configurable parameters of a given integrated circuit are determined by the correspondence of the given integrated circuit to the specified device;
wherein the configurable parameters of the base device comprise a cell payload size, a chip version, a clock speed, a switching capacity, and a configuration type selected from a plurality of configuration types comprising a centralized configuration, a stackable configuration and a distributed configuration; and
wherein the interface permits user selection of any one of the plurality of configuration types.

2. The method of claim 1 wherein the at least one switch fabric comprises at least one multistage switch fabric.

3. The method of claim 2 wherein the integrated circuits comprise at least two ingress devices, at least one cross-connect device and at least two egress devices.

4. The method of claim 1 wherein the interface includes a listing of the integrated circuits.

5. The method of claim 1 wherein the configurable parameters comprise a number of ports of the switch fabric.

6. The method of claim 1 wherein the software-based development tool comprises an automatic configuration generation module which generates the simulation configuration for the switch fabric based on the current values of the configurable parameters.

7. The method of claim 1 wherein the simulation configuration is generated utilizing an object-oriented programming construct comprising a base class, corresponding to the base device, and an associated generation interface.

8. The method of claim 7 wherein the generation interface declares a generate function that is implemented by each of a plurality of generators, each of the plurality of generators corresponding to a different configuration of the switch fabric.

9. The method of claim 8 wherein the plurality of generators comprises a centralized configuration generator, a stackable configuration generator and a distributed configuration generator, corresponding to respective centralized, stackable and distributed configurations of the switch fabric.

10. The method of claim 1 wherein the software-based development tool runs at least in part on an information processing device comprising a processor and an associated memory.

11. The method of claim 1 wherein the software-based development tool comprises a simulator control module, a set of interfaces, and circuit element modules each corresponding to an associated one of the integrated circuits.

12. The method of claim 1 wherein the configurable parameters of the switch fabric comprise a clock speed of at least a given one of the integrated circuits.

13. The method of claim 1 wherein the switching capacity of the switch fabric determines a number of integrated circuits included in the switch fabric.

14. The method of claim 1 wherein each integrated circuit has at least one block function associated therewith.

15. The method of claim 1 wherein the one or more configurable parameters of the given integrated circuit comprise a number of ports on the corresponding device.

16. An apparatus for simulating the operation of at least one switch fabric comprising a plurality of integrated circuits of a designated chip set, the apparatus comprising:

an information processing device having a processor and a memory;

the information processing device implementing a software-based development tool providing an interface for user control of configurable parameters of the switch fabric, the development tool being operative to automatically generate a simulation configuration for the switch fabric based on current values of the configurable parameters;

the simulation configuration being generated without requiring further user input;

the simulation configuration specifying interconnections between the integrated circuits which satisfy the current values of the configurable parameters;

wherein the ene-ewe configurable parameters of the switch fabric comprise one or more configurable parameters of each of the integrated circuits and configurable parameters of a base device for the designated chip set;

wherein each integrated circuit of the designated chip set corresponds to a specified ingress device, a specified cross-connect device or a specified egress device;

wherein the one or more configurable parameters of a given integrated circuit are determined by the correspondence of the given integrated circuit to the specified device;

wherein the configurable parameters of the base device comprise a cell payload size, a chip version, a clock speed, a switching capacity, and a configuration type selected from a plurality of configuration types comprising a centralized configuration, a stackable configuration and a distributed configuration; and wherein the interface permits user selection of any one of the plurality of configuration types.

17. The apparatus of claim 16 wherein the one or more configurable parameters of the given integrated circuit comprise a number of ports on the corresponding device.

18. The apparatus of claim 16 wherein the configurable parameters of the switch fabric comprise a clock speed of at least a given one of the integrated circuits.

19. An article of manufacture comprising a storage medium containing one or more software programs for use in simulating the operation of at least one switch fabric comprising a plurality of integrated circuits of a designated chip set, utilizing a software-based development tool, wherein the one or more software programs when executed implement the steps of:

providing in the software-based development tool an interface for user control of configurable parameters of the switch fabric; and automatically generating a simulation configuration for the switch fabric based on current values of the configurable parameters;

the simulation configuration being generated without requiring further user input;

the simulation configuration specifying interconnections between the integrated circuits which satisfy the current values of the configurable parameters;

wherein the configurable parameters of the switch fabric comprise one or more configurable parameters of each of the integrated circuits and configurable parameters of a base device for the designated chip set;

wherein each integrated circuit of the designated chip set corresponds to a specified ingress device, a specified cross-connect device or a specified egress device;

wherein the one or more configurable parameters of a given integrated circuit are determined by the correspondence of the given integrated circuit to the specified device; and wherein the configurable parameters of the base device comprise a cell payload size, a chip version, a clock speed, a switching capacity, and a configuration type selected from a plurality of configuration types comprising a centralized configuration, a stackable configuration and a distributed configuration; and wherein the interface permits user selection of any one of the plurality of configuration types.

20. The article of claim 19 wherein the configurable parameters of the switch fabric comprise a clock speed of at least a given one of the integrated circuits.

* * * * *

UNITED STATES PATENT AND TRADEMARK OFFICE
CERTIFICATE OF CORRECTION

| | | |
|---|---|---|
| PATENT NO. | : 7,822,589 B2 | Page 1 of 1 |
| APPLICATION NO. | : 10/620045 | |
| DATED | : October 26, 2010 | |
| INVENTOR(S) | : R. Bhattacharya et al. | |

It is certified that error appears in the above-identified patent and that said Letters Patent is hereby corrected as shown below:

In the claims:

Claim 16, col. 9, line 22, please delete "ene-ewe".

Signed and Sealed this
Twenty-fifth Day of January, 2011

David J. Kappos
*Director of the United States Patent and Trademark Office*